United States Patent
Hung et al.

(10) Patent No.: US 8,045,403 B2
(45) Date of Patent: *Oct. 25, 2011

(54) PROGRAMMING METHOD AND MEMORY DEVICE USING THE SAME

(75) Inventors: Chun-Hsiung Hung, Hsinchu (TW); Hsin-Yi Ho, Hsinchu (TW)

(73) Assignee: Macronix International Co., Ltd., Hsinchu (TW)

(*) Notice: Subject to any disclaimer, the term of this patent is extended or adjusted under 35 U.S.C. 154(b) by 0 days.

This patent is subject to a terminal disclaimer.

(21) Appl. No.: 12/943,443

(22) Filed: Nov. 10, 2010

(65) Prior Publication Data

US 2011/0055670 A1    Mar. 3, 2011

Related U.S. Application Data

(63) Continuation of application No. 12/196,417, filed on Aug. 22, 2008, now Pat. No. 7,835,203.

(60) Provisional application No. 61/035,750, filed on Mar. 12, 2008.

(51) Int. Cl.
*G11C 7/00* (2006.01)
(52) U.S. Cl. .......... 365/189.16; 365/189.12; 365/185.22
(58) Field of Classification Search ............. 365/189.16, 365/189.12, 185.22
See application file for complete search history.

(56) References Cited

U.S. PATENT DOCUMENTS

| | | | |
|---|---|---|---|
| 6,683,811 B2 | 1/2004 | Ishii et al. | |
| 6,870,768 B2 | 3/2005 | Cernea et al. | |
| 7,072,222 B2 * | 7/2006 | Ishii et al. | 365/185.24 |
| 7,609,579 B2 | 10/2009 | Shiah et al. | |
| 2004/0047182 A1 | 3/2004 | Cernea et al. | |
| 2008/0025095 A1 | 1/2008 | Ahn et al. | |

FOREIGN PATENT DOCUMENTS

CN    1703757    11/2005

OTHER PUBLICATIONS

English language translation of abstract of CN 1703757 (published Nov. 30, 2005).

* cited by examiner

*Primary Examiner* — Son Dinh
*Assistant Examiner* — Nam Nguyen
(74) *Attorney, Agent, or Firm* — Thomas, Kayden, Horstemeyer & Risley, LLP

(57) ABSTRACT

A programming method applied to a memory is provided. The memory includes a number of memory cells. The method includes the following steps. A target cell of the memory cells is programmed in response to a first programming command. The target cell is programmed in response to a second programming command.

20 Claims, 5 Drawing Sheets

PROGRAMMING METHOD AND MEMORY DEVICE USING THE SAME

This application is a continuation application of U.S. application Ser. No. 12/196,417, filed on Aug. 22, 2008, now U.S. Pat. No. 7,835,203, which claims the benefit of U.S. provisional application Ser. No. 61/035,750, filed Mar. 12, 2008, the subject matters of which are incorporated herein by reference.

BACKGROUND OF THE INVENTION

1. Field of the Invention

The invention relates in general to a programming method and a memory device using the same, and more particularly to a programming method capable of making a threshold voltage more precise, and a memory device using the same.

2. Description of the Related Art

Non-volatile memories are widely applied to various products, such as mobile phones, digital cameras or personal digital assistants (PDAs). The non-volatile memories may be classified into many types, one of which is a flash memory that is frequently seen.

A memory array has many memory cells for trapping charges. The trapped charges influence the state of the threshold voltage of each memory cell so that the object of storing data can be achieved. That is, the stored data content can be obtained according to the state of the threshold voltage of the memory cell. Furthermore, in the memory array having many memory cells, the physical properties of the memory cells are not completely the same. So, the threshold voltages of the memory cells are not completely the same even if the same data is stored in the memory cells. Consequently, the state of the memory array is typically represented by the threshold voltage distribution.

FIG. 1 (Prior Art) is a schematic illustration showing an example of the threshold voltage distribution of a memory array. In this example, it is assumed that each memory cell can store one bit of data, and the state of the memory cell may be one of threshold voltage states S1 and S2. Because the threshold voltage distribution influences the operation of reading the memory cell, a read error tends to occur if the margin of the threshold voltage distribution of the threshold voltage represented by the threshold voltage state becomes wider. Therefore, it is an important subject of the industry to narrow the margin of the threshold voltage distribution of the memory array when the memory cells are programmed.

SUMMARY OF THE INVENTION

The invention is directed to a programming method and a memory device using the same, wherein two programming operations are executed so that a margin of the threshold voltage distribution of a memory array is narrowed and the data reading correctness can be enhanced.

According to a first aspect of the present invention, a programming method applied to a memory device is provided. The memory including a number of memory cells. The method includes the following steps. A target cell of the memory cells is programmed in response to a first programming command. The target cell is programmed in response to a second programming command.

According to a second aspect of the present invention, a memory device is provided. The memory device includes a number of memory cells and a control circuit. The control circuit is for programming a target cell of the memory cells in response to a first programming command and then programming the target cell in response to a second programming command.

The invention will become apparent from the following detailed description of the preferred but non-limiting embodiments. The following description is made with reference to the accompanying drawings.

DETAILED DESCRIPTION OF THE INVENTION

Figure 1:
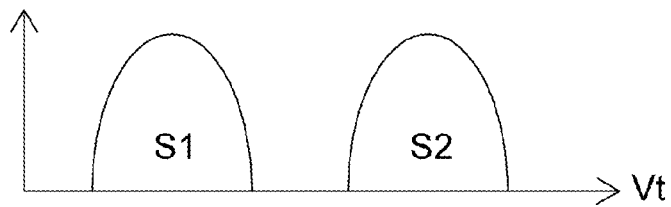
FIG. 1 (Prior Art) is a schematic illustration showing an example of the threshold voltage distribution of a memory array.
Figure 2:
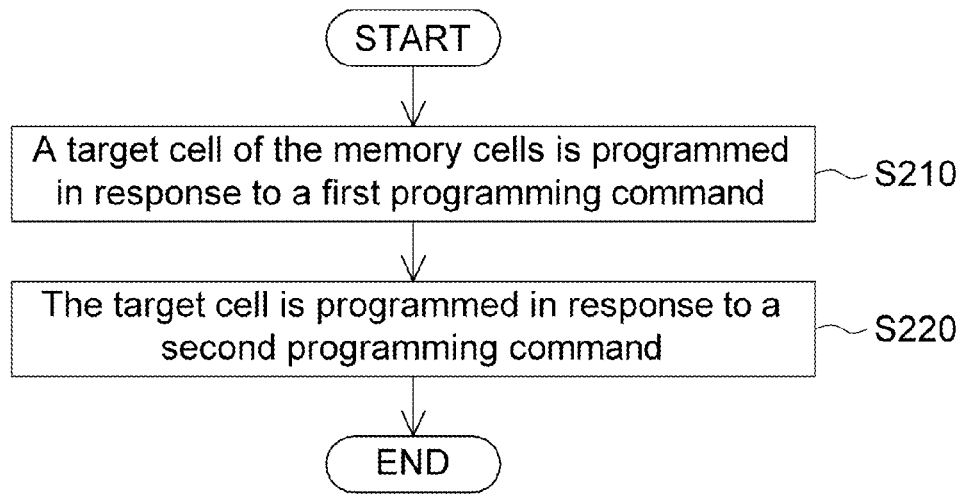
FIG. 2 is a flow chart showing a programming method according to an embodiment of the invention.

FIG. 2 is a flow chart showing a programming method according to an embodiment of the invention. The programming method according to this invention is applied to a memory having many memory cells. The method includes the following steps. In step S210, a target cell of the memory cells is programmed in response to a first programming command. In step S220, the target cell is programmed in response to a second programming command.

Figure 3A:
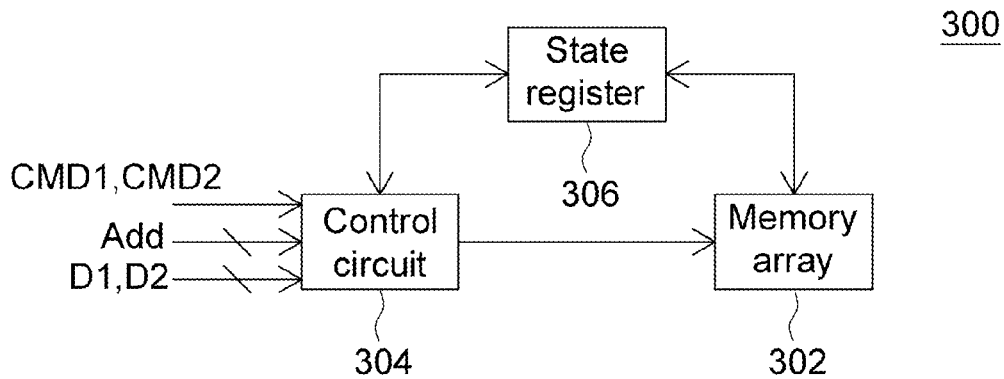
FIG. 3A is a schematic illustration showing a memory device according to an embodiment of the invention.
Figure 3B:
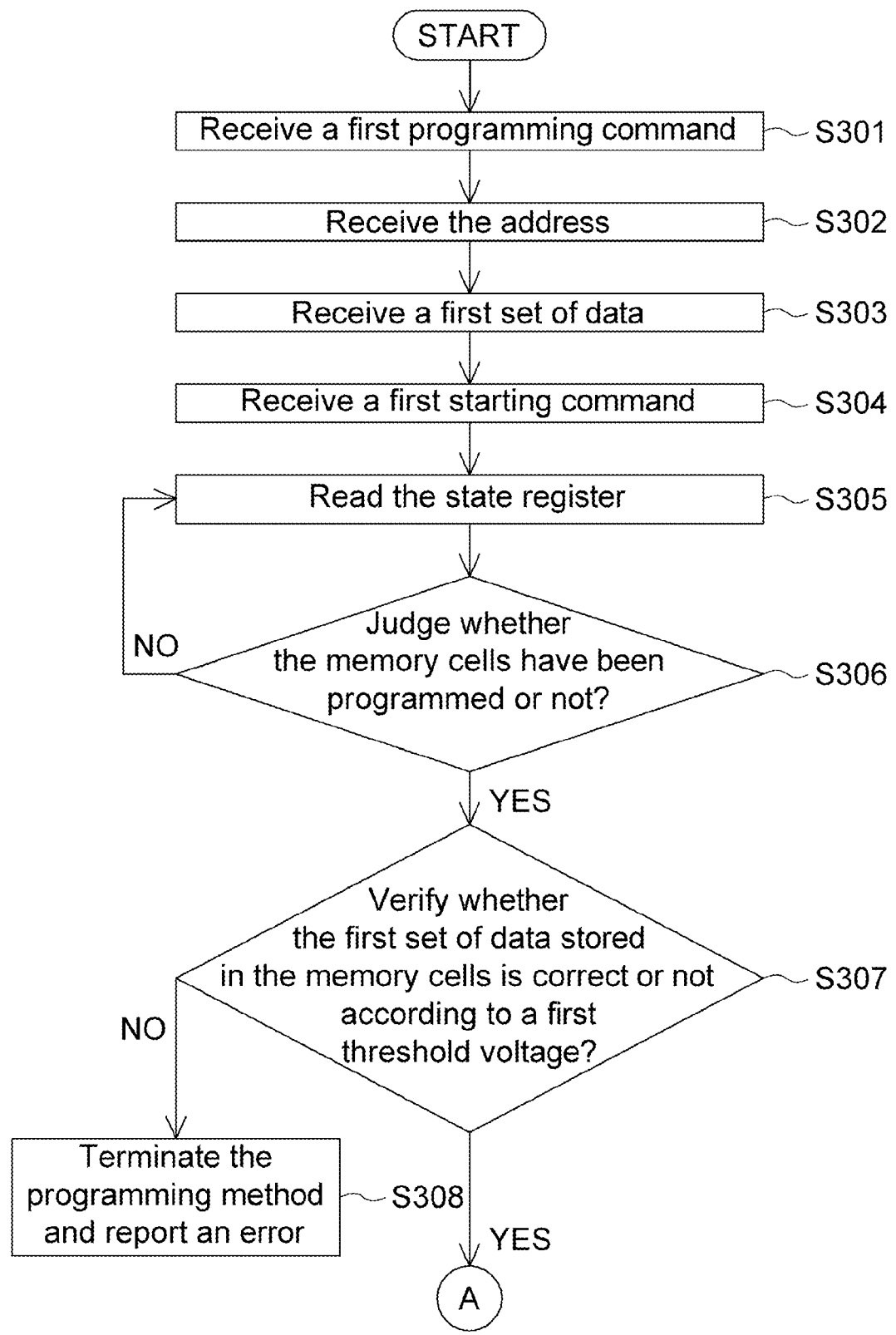
FIGS. 3B and 3C are a detailed flow chart showing the programming method executed by the memory device of FIG. 3A.
Figure 3C:
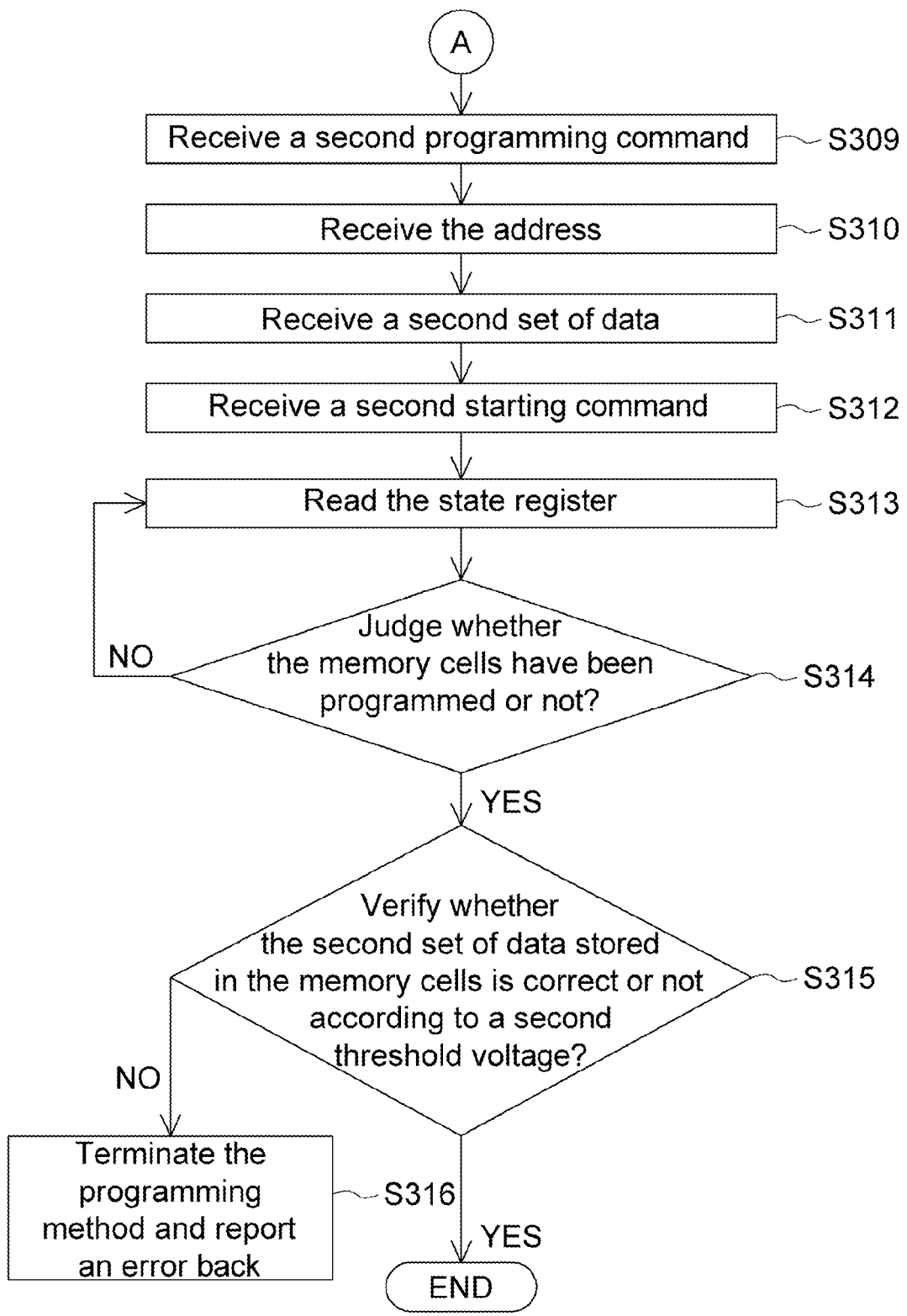

How the memory device executes the programming method will be further described in detail in the following. FIG. 3A is a schematic illustration showing a memory device 300 according to an embodiment of the invention. FIGS. 3B and 3C are a detailed flow chart showing the programming method executed by the memory device of FIG. 3A. Referring to FIGS. 3A~3C, the memory device 300 includes a memory array 302, a control circuit 304 and a state register 306. The memory array 302 has many memory cells M each having its address.

The control circuit 304 is for executing the above-mentioned steps S210 and S220 shown in FIG. 2, so as to program a target cell of the memory cells in response to a first programming command CMD1, and then to program the target cell again in response to a second programming command CMD2. In an exemplary embodiment, the control circuit 304 receives a first programming command CMD1, an address Add, a first set of data D1 and a second programming command CMD2, as shown in steps S301 to S303. The control circuit 304 has many registers and buffers (not shown), for example. The registers store the programming commands CMD1 and CMD2, or other kinds of commands. The buffers store the address Add and the first set of data D1. The control circuit 304 starts to receive the address Add and the first set of data D1 in response to the first programming command CMD1, and performs a first programming operation on the memory cells M according to the address Add and the first set of data D1.

Preferably, the control circuit 304 further receives a first starting command ST1 after receiving the first set of data D1, as shown in step S304. The control circuit 304 starts to perform the first programming operation after receiving the first starting command ST1. In practice, the control circuit 304 receives the first programming command CMD1 and then loads the received address Add and first set of data D1 into the buffer. Next, the control circuit 304 receives the first starting command ST1 and then starts to perform the operation of programming the memory cells M.

In the first programming operation, the control circuit 304 executes a programming loop in order to program the first set of data D1 into the memory cells M according to the address Add. For example, it is assumed that the address Add corresponds to eight memory cells and the first set of data D1 contains eight pieces of data corresponding to the memory cells. Therefore, when the control circuit 304 is executing the programming loop, it writes one piece of data into the corresponding memory cell to sequentially program the eight memory cells.

When the control circuit 304 is executing the programming loop, it reads the data of the state register 306 to judge whether the memory cells M have been programmed or not, as shown in steps S305 and S306. The data stored in the state register 306 corresponds to various states of the memory array 302, for example. So, the state of the memory array 302 may be obtained by reading the data. In practice, for example, the operation of reading the state register 306 is performed by checking the level of the pin of the memory device 300, such as the level of the pin I/O 0, so that the state of the memory array 302 is obtained. If the read data of the pin has a high level (i.e., the pin I/O 0 is 1), it indicates that the memory array 302 is in a busy state. On the contrary, if the read data of the pin has a low level (i.e., the pin I/O 0 is 0), it indicates that the memory array 302 is in a ready state.

Next, in step S306, it is judged whether the programming loop has been finished or not according to the state of the memory array 302. If it is obtained that the memory array 302 is in the busy state after the data of the state register 306 is read, it indicates that the memory cells M have not been programmed yet. If the memory array 302 is in the ready state, it indicates that the memory cells M have been programmed.

If the memory cells M have not been programmed, the step S305 is repeated and the control circuit 304 continues to read the state register 306 to judge whether the memory cells M have been programmed or not. If the memory cells M have been programmed, the control circuit 304 verifies whether the first set of data D1 stored in the memory cells M is correct or not according to a first threshold voltage, as shown in step S307. In practice, for example, the operation of verifying whether the data is correct or not is performed by checking the level of the pin I/O 6 of the memory device 300 so that the state of the memory array 302 may be obtained. If the read data of the pin has the low level (i.e., the pin I/O 6 is 0), it indicates that the data is verified as correct. On the contrary, if the read data of the pin has the high level (i.e., the pin I/O 6 is 1), it indicates that the data is verified as incorrect. If the first set of data D1 stored in the memory cells M is incorrect, the control circuit 304 terminates programming and reports an error, as shown in step S308. If the first set of data D1 stored in the memory cells M is correct, the control circuit 304 then receives the second programming command CMD2, as shown in step S309.

After the memory cells M finish the first programming operation and the second programming command CMD2 is received, the control circuit 304 further performs a second programming operation on the memory cells M in response to the second programming command CMD2. Preferably, the control circuit 304 further receives the address Add, a second set of data D2 and a second starting command ST2 after receiving the second programming command CMD2, as shown in step S310 to S312. In practice, the first set of data D1 may be the same as or different from the second set of data D2. The control circuit 304 starts to perform the second programming operation on the memory cells M after receiving the second starting command ST2 according to the address Add and the second set of data D2.

The second programming operation is similar to the first programming operation. When the control circuit 304 is performing the second programming operation, it executes a programming loop to program the second set of data D2 into the memory cells M according to the address Add. When the control circuit 304 is executing the programming loop, it reads the state register 306 to judge whether the memory cells M have been programmed or not, as shown in steps S313 and S314.

Similarly, if the memory cells M have not been programmed yet, the control circuit 304 continues to read the state register 306 to judge whether the memory cells have been programmed or not, as shown in step S313. If the memory cells M have been programmed, the control circuit 304 verifies whether the second set of data D2 stored in the memory cells M is correct or not according to a second threshold voltage, as shown in step S315. If the second set of data D2 stored in the memory cells M is incorrect, the control circuit 304 terminates programming and reports an error, as shown in step S316. If the second set of data D2 stored in the memory cells M is correct, the control circuit 304 terminates the operation of programming the memory cells M.

After the memory cells have been programmed twice, the condition of the broadened margin of the threshold voltage distribution caused by the programming operations of the memory cells may be improved. Illustrations will be made according to two examples.

Figure 4:
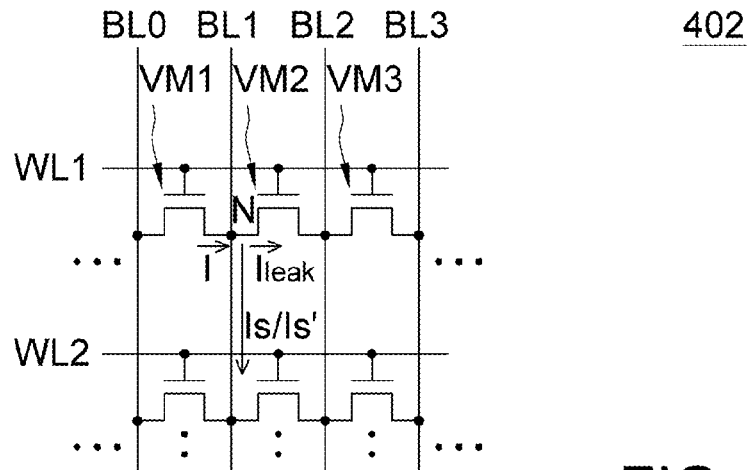
FIG. 4 is a schematic illustration showing an example of the architecture of a virtual ground memory array.

First, a virtual ground memory array will be described as an example. FIG. 4 is a schematic illustration showing an example of the architecture of a virtual ground memory array 402. The virtual ground memory array 402 includes many memory cells, such as the neighboring memory cells VM1 and VM2. When the memory cell VM2 is being programmed, the threshold voltage of the programmed memory cell VM1 is influenced, and this phenomenon is referred to as a neighbor effect.

The neighbor effect will be described in the following. When a conventional programming operation is being performed, the memory cells VM1 and VM2 of the virtual ground memory array are sequentially programmed. When the memory cell VM1 is being programmed, it is necessary to judge whether the threshold voltage of the memory cell VM1 has reached the programming target voltage or not according to the operation of reading the memory cell VM1. In this reading operation, the un-programmed memory cell VM2 has the low threshold voltage, so the read current I, which actually flows through the memory cell VM1 and then the node N, is divided into a leakage current Ileak flowing toward the memory cell VM2, and a sense current Is. The sense current Is (Is=I-Ileak) is received by a sense amplifier (not shown) and the data stored in the memory cell VM1 is judged according to the sense current Is. Consequently, the threshold voltage Vt of the memory cell VM1 relates to the sense current Is before the memory cell VM2 is programmed.

It is assumed that the programmed memory cell VM2 has the high threshold voltage. At this time, if the memory cell VM1 is again to be read, the high threshold voltage of the memory cell VM2 turns off the memory cell VM2 so that no leakage current Ileak flows through the memory cell VM2. That is, the read current I flowing through the memory cell VM1 and the node N is substantially equal to the sense current Is'(Is'=I) in the reading operation at this time.

Because the sense current Is' is higher than the sense current Is, the threshold voltage Vt' sensed by the sense amplifier is lower than the sensed threshold voltage Vt. That is, after the memory cell VM2 is programmed, the sensed threshold voltage Vt' of the memory cell VM1 is lowered. Similarly, in FIG. 4, the threshold voltage of the memory cell VM2 is also influenced after the memory cell VM3 is programmed. Therefore, in the operation of programming neighboring two memory cells of the virtual ground memory array, when the later memory cell is being programmed, the threshold voltage of the former memory cell is influenced so that the margin of the threshold voltage distribution of the memory array is broadened.

The programming method according to the embodiment of the invention can solve the problem encountered by the neighbor effect induced in the conventional programming method. As shown in FIG. 4, the second programming operation triggered by the second command is further performed on the memory cells VM1 and VM2 after the first programming operation is finished in the embodiment of the invention. In the second programming operation, because the memory cell VM2 has the high threshold voltage, no leakage current Ileak flows through the memory cell VM2. Thus, when the memory cell VM1 is programmed at the second time, and is read to verify whether it has been programmed to the target voltage or not in order to decide whether the programming operation has to be continued or not, the sense current Is' obtained in this reading operation is the current actually flowing through the memory cell VM1. Therefore, the threshold voltage obtained by the sense amplifier approaches the real threshold voltage of the memory cell VM1, and the problem of the neighbor effect may be solved.

Figure 5A:
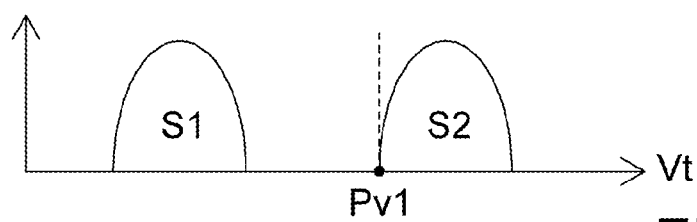
FIG. 5A shows the threshold voltage distribution of the virtual ground memory array before a neighbor effect occurs.
Figure 5B:
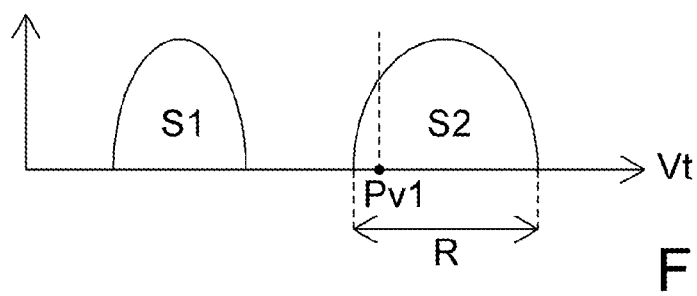
FIG. 5B shows the threshold voltage distribution of the virtual ground memory array after the neighbor effect occurs.

FIG. 5A shows the threshold voltage distribution of the virtual ground memory array 402 before a neighbor effect occurs. FIG. 5B shows the threshold voltage distribution of the virtual ground memory array 402 after the neighbor effect occurs. As shown in FIG. 5B, the sensed threshold voltage of the memory cell VM1 is changed under the neighbor effect caused by the memory cell VM2 so that the margin R of the threshold voltage distribution is broadened. When the VM2 is in erased state, the leakage current of VM1 gets worst. So the sensed threshold voltage of the memory cell VM1 is higher than actual condition. After the VM2 has been programmed, the leakage current of VM1 is reduced, and the sensed threshold voltage of the memory cell VM1 will be lower than the previous sensed result (lower than PV1 in FIG. 5B).

Figure 5C:
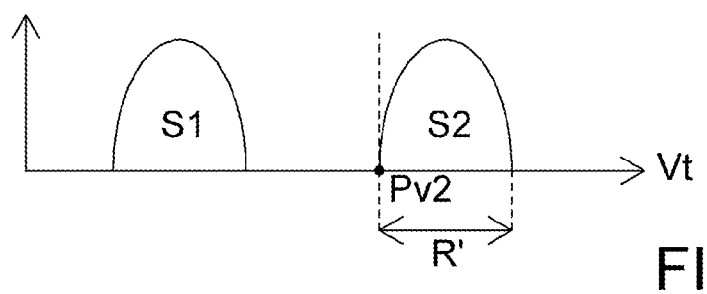
FIG. 5C shows the threshold voltage distribution of the virtual ground memory array after a second programming operation is performed.

FIG. 5C shows the threshold voltage distribution of the virtual ground memory array 402 after a second programming operation is performed. In the second programming operation, no leakage current Ileak exists. So, the margin R' of the threshold voltage distribution is narrower than the margin R.

Figure 6:
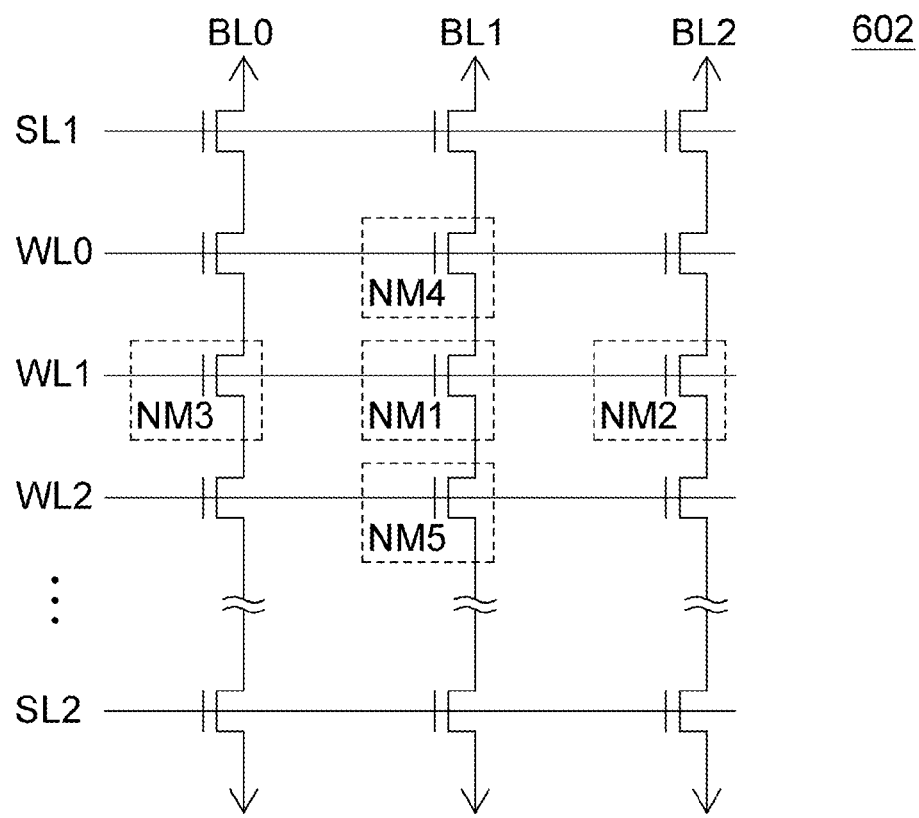
FIG. 6 is a schematic illustration showing an example of the architecture of a NAND flash memory array.

In addition, illustrations will be made by taking a NAND flash memory array as an example. FIG. 6 is a schematic illustration showing an example of the architecture of a NAND flash memory array 602. Referring to FIG. 6, the NAND flash memory array 602 includes many memory cells, such as many neighboring memory cells NM1 to NM5. When the memory cells NM2 to NM5 are being programmed, the threshold voltage of the memory cell NM1 is influenced so that the threshold voltage of the memory cell NM1 is changed. This phenomenon is referred to as a coupling effect.

Figure 7:
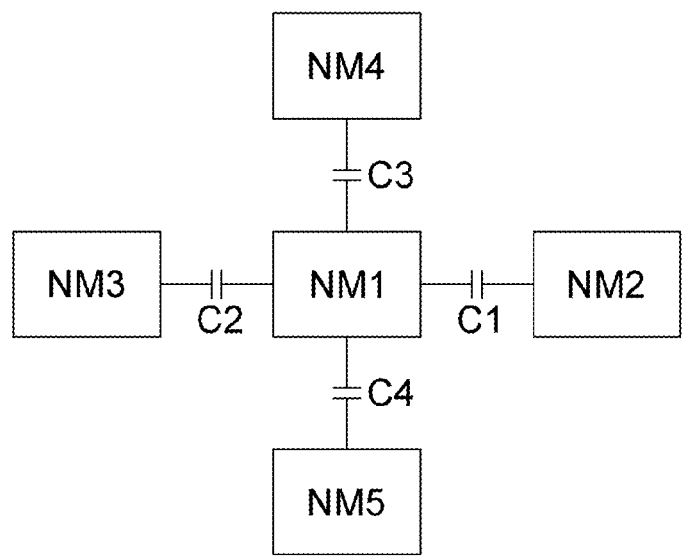
FIG. 7 shows an example of an equivalent circuit diagram of neighboring memory cells of FIG. 6 under a coupling effect.

The coupling effect will be described in the following. FIG. 7 shows an example of an equivalent circuit diagram of the neighboring memory cells of FIG. 6 under the coupling effect. Because coupling capacitors C1 to C4 exist between the memory cell NM1 and each one of the memory cells NM2 to NM5, respectively, the charges stored in the memory cells NM2 to NM5 change, through the coupling capacitors C1 to C4, the charges stored in the memory cell NM1 when the memory cells NM2 to NM5 are being programmed. Thus, the threshold voltage of the memory cell NM1 is influenced.

For example, the memory cells NM1 and NM2 of the NAND flash memory array are sequentially programmed in the first programming operation, and it is assumed that the memory cells NM1 and NM2 are programmed to the threshold voltage equal to 3 volts. After the memory cell NM1 is programmed, the memory cell NM1 has the threshold voltage equal to 3 volts, while the un-programmed memory cell NM2 has the threshold voltage equal to 0 volts. At this time, the threshold voltage difference D1 is equal to 3 volts. Thereafter, if the memory cell NM2 is programmed, the charges of the memory cell NM2 change, through the coupling capacitor C1, the charges stored in the memory cell NM1 so that the threshold voltage of the memory cell NM1 is influenced by the coupling effect and thus rises. Therefore, when the memory cells of the NAND flash memory array are being programmed, the threshold voltage of one memory cell is influenced by another memory cell adjacent to this memory cell so that the margin of the threshold voltage distribution of the memory array is broadened.

The programming method according to the embodiment of the invention can ease the problem of the coupling effect. As shown in FIG. 6, after the first programming operation is finished, the second programming command is performed to again program the memory cells NM1 and NM2. In the second programming operation, it is assumed that the target threshold voltage for programming the memory cell NM1 is equal to 3.2 volts. If the memory cell NM1 is programmed and the memory cell NM2 is to be then programmed, the extent that the memory cell NM2 changes, through the coupling capacitor C1, the charges stored in the memory cell NM1 is eased. This is because when the memory cell NM2 is again programmed, the threshold voltage difference D2 between the memory cell NM2 and the memory cell NM1 is reduced to D2=3.2−3=0.2(V), which is smaller than the threshold voltage difference D1 (=3V) during the first programming operation. Therefore, the increased level of the threshold voltage of the memory cell NM1 caused by the coupling effect is reduced when the second programming operation is being performed so that the threshold voltage of the memory cell NM1 is closer to the target threshold voltage to be programmed and the influence of the coupling effect is eased. Consequently, the margin of the threshold voltage distribution of the NAND flash memory array 602 may be effectively narrowed.

The programming method according to the embodiment of the invention may be applied to, without limitation to, the virtual ground memory array and the NAND flash memory array.

In the programming method and the memory device using the same according to the embodiment of the invention, two programming operations are executed so that the phenomenon of the broadened margin of the threshold voltage distribution of the memory array caused by the neighbor effect or coupling effect can be eased. Thus, the margin of the voltage of reading the memory cell after the programming operations can be broadened, and the correctness of reading the memory cell may be enhanced.

While the invention has been described by way of example and in terms of a preferred embodiment, it is to be understood that the invention is not limited thereto. On the contrary, it is intended to cover various modifications and similar arrangements and procedures, and the scope of the appended claims therefore should be accorded the broadest interpretation so as to encompass all such modifications and similar arrangements and procedures.

What is claimed is:

1. A programming method of a memory comprising a plurality of memory cells, in a case when a data is to be stored into a target cell of the memory cells, the method comprising the steps of:
performing a first programming operation to program the target cell of the memory cells; and
performing a second programming operation to program the target cell again.

2. The method according to claim 1, further comprising the steps of:
receiving a first programming command;
receiving an address corresponding to the target cell;
receiving a first set of data; and
wherein the first programming operation is performed on the target cell according to the address and the first set of data.

3. The method according to claim 1, wherein the first and the second programming operations are performed in response to one programming command.

4. The method according to claim 1, wherein the step of performing the first programming operation comprises the steps of:
reading a state register to judge whether the target cell has been programmed or not, and performing the following steps if the target cell has been programmed or repeating the step of reading the state register if the target cell has not been programmed;
verifying whether the first set of data stored in the target cell is correct or not according to a first threshold voltage; and
terminating the method and reporting an error when the first set of data stored in the target cell is incorrect;
wherein the step of performing the second programming operation is executed after the first set of data stored in the target cell is correct.

5. The method according to claim 1, wherein the first and the second programming operations are performed in response to two different commands.

6. The method according to claim 1, wherein the first and the second programming operations are performed in response to a same command.

7. The method according to claim 1, further comprises the step of:
receiving a second starting command to start performing the second programming operation.

8. The method according to claim 1, wherein the step of performing the second programming operation comprises the steps of:
reading a state register to judge whether the target cell has been programmed or not, and performing the following steps if the target cell has been programmed or repeating the step of reading the state register if the target cell has not been programmed;
verifying whether the second set of data stored in the target cell is correct or not according to a second threshold voltage;
terminating the method and reporting an error when the second set of data stored in the target cell is incorrect; and
terminating the method when the second set of data stored in the target cell is correct.

9. The method according to claim 1, further comprising the step of:
programming an adjacent cell of the target cell from a low threshold voltage to a high threshold voltage before the target cell is programmed in the second programming operation.

10. A memory device, comprising:
a plurality of memory cells; and
a control circuit for, in a case when a data is to be stored into a target cell of the memory cells, performing a first programming to program the target cell of the memory cells, and then performing a second programming operation to program the target cell again.

11. The memory device according to claim 10, wherein the control circuit is for receiving a first programming command, an address corresponding to the target cell, and a first set of data, and the control circuit is for performing the first programming operation on the target cell according to the address and the first set of data.

12. The memory device according to claim 10, wherein the first and the second programming operations are performed in response to one programming command.

13. The memory device according to claim 10, wherein the memory device further comprises a state register;
wherein when the control circuit performs the first programming operation, the control circuit reads the state register to judge whether the target cell has been programmed or not;
wherein if the control circuit judges that the target cell has been programmed, the control circuit verifies whether the first set of data stored in the target cell is correct or not;
wherein the control circuit terminates programming and reports an error if the first set of data stored in the target cell is incorrect, and the control circuit performs the second programming operation after the first set of data stored in the target cell is correct;
wherein if the control circuit judges that the target cell has not been programmed, the control circuit continues to read the state register to judge whether the target cell has been programmed or not.

14. The memory device according to claim 10, wherein the first and the second programming operations are performed in response to two different commands.

15. The memory device according to claim 10, wherein the first and the second programming operations are performed in response to a same command.

16. The memory device according to claim 10, wherein the memory device further comprises a state register;
wherein when the control circuit performs the second programming operation, the control circuit reads the state register to judge whether the target cell has been programmed or not;

wherein if the control circuit judges that the target cell have been programmed, the control circuit verifies whether the second set of data stored in the target cell is correct or not;

wherein if the control circuit judges that the target cell has not been programmed, the control circuit continues to read the state register to judge whether the target cell has been programmed or not.

17. The memory device according to claim 10, wherein the control circuit is further for programming an adjacent cell of the target cell from a low threshold voltage to a high threshold voltage before programming the target cell in the second programming operation.

18. A programming method applied to a memory, the memory comprising a plurality of memory cells, the method comprising the steps of:

changing a first cell of the memory cells from a low threshold voltage to a high threshold voltage; and programming a second cell adjacent to the first cell after the step of changing the first cell.

19. The method according to claim 18, wherein the changing and the programming steps are performed based upon one command.

20. The method according to claim 18, wherein the changing step and the programming steps are performed based upon two commands.

* * * * *